(12) United States Patent
Konno et al.

(10) Patent No.: US 7,868,285 B2
(45) Date of Patent: Jan. 11, 2011

(54) ARRAY-TYPE LIGHT RECEIVING DEVICE AND LIGHT COLLECTION METHOD

(75) Inventors: Yusaku Konno, Kanagawa-ken (JP); Naotada Okada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/139,714

(22) Filed: Jun. 16, 2008

(65) Prior Publication Data
US 2008/0315074 A1  Dec. 25, 2008

(30) Foreign Application Priority Data
Jun. 21, 2007  (JP) .............................. 2007-163524

(51) Int. Cl.
*H01L 27/00* (2006.01)
(52) U.S. Cl. ............. 250/208.1; 250/214.1; 250/237 R; 257/432; 257/435
(58) Field of Classification Search ............. 250/208.1, 250/214.1, 216, 237 G, 237 R; 257/432, 257/435, 436
See application file for complete search history.

(56) References Cited

U.S. PATENT DOCUMENTS

2006/0115230 A1  6/2006  Komoguchi et al.
2007/0052053 A1*  3/2007  Lee ............................ 257/462
2007/0069108 A1  3/2007  Inaba

FOREIGN PATENT DOCUMENTS

| EP | 1 930 950 A2 | 6/2008 |
|---|---|---|
| JP | 2004-163892 | 6/2004 |
| JP | 2004-193500 A | 7/2004 |
| JP | 2006-019627 | 1/2006 |
| JP | 2006-114592 | 4/2006 |
| JP | 2006-229004 | 8/2006 |
| JP | 2006-324439 | 11/2006 |
| KR | 2005-0053522 | 6/2005 |
| KR | 10-2006-0076436 A | 7/2006 |
| KR | 10-2007-0027580 A | 3/2007 |

OTHER PUBLICATIONS

Notice of Allowance issued Sep. 27, 2010, in Korean Patent Application No. 10-2008-0058227 (with English-language Translation).

* cited by examiner

*Primary Examiner*—Kevin Pyo
(74) *Attorney, Agent, or Firm*—Oblon, Spivak, McClelland, Maier & Neustadt, L.L.P.

(57) ABSTRACT

An array-type light receiving device includes a first light collector, a second light collector configured to receive light collected by the first light collector, and a light receiver configured to receive light collected by the second light collector. The first light collector has a spherical shape, the second light collector has a high refractive index portion and a low refractive index portion, and the high refractive index portion has one of a cylindrical shape and a polygonal prismatic shape.

18 Claims, 11 Drawing Sheets

ARRAY-TYPE LIGHT RECEIVING DEVICE AND LIGHT COLLECTION METHOD

CROSS-REFERENCE TO RELATED APPLICATIONS

This application is based upon and claims the benefit of priority from the prior Japanese Patent Application No. 2007-163524, filed on Jun. 21, 2007; the entire contents of which are incorporated herein by reference.

BACKGROUND OF THE INVENTION

1. Field of the Invention

This invention relates to an array-type light receiving device, and more particularly to an array-type light receiving device and a light collection method with improved light receiving efficiency.

2. Background Art

Recently, with the increasing resolution of digital cameras and mobile phone-mounted cameras, downscaling of array-type light receiving devices mounted thereon has been in progress. However, the pixel pitch of the light receiving device is narrowed with downscaling. Hence, unfortunately, incident light entering the lens cannot be efficiently guided to the light receiving section.

Conventionally, a light collector having a spherical shape is used for an array-type light receiving device. However, although the light collector having only a spherical shape has an effect of allowing light perpendicularly incident on the array-type light receiving device to be efficiently guided to the light receiving section, it has little effect of allowing obliquely incident light to be efficiently guided to the light receiving section.

For example, when light is incident on an array-type light receiving device from a camera lens, the component of perpendicularly incident light is intense at the center of the array-type light receiving device, and the component of obliquely incident light is intense at the periphery of the array-type light receiving device. The obliquely incident light impinges on interconnection in the device and may fail to reach the light receiving section in the device, resulting in decreasing the light receiving sensitivity at the periphery. Thus, in two-dimensionally arrayed devices, the light receiving efficiency is high at the center, but low at the periphery, producing a sensitivity difference (shading) therebetween. Furthermore, unless obliquely incident light is delivered to the light receiving section of the device using a light collector, it enters the light receiving section of an adjacent pixel and causes color mottling.

To solve the problem of shading, JP-A 2006-324439(Kokai) discloses a technique of shifting the center of the light receiving section with the distance from the center of the arrayed devices. Although this technique can prevent shading, the manufacturing process is complicated because each pixel has a different structure.

JP-A 2006-229004(Kokai) discloses a technique of gradually increasing the opening diameter of the top interconnect of multilayer interconnection with the distance from the center of the arrayed devices. Although this technique can prevent shading, the manufacturing process is complicated because each pixel has a different structure.

JP-A 2006-114592(Kokai) discloses a technique of using a spherical shape for a first light collector and a second collector, in which the shape is varied for each pixel. Although this technique can prevent shading and color mottling, the spherical shape alone cannot sufficiently increase the efficiency of receiving obliquely incident light, and the manufacturing process is complicated because each pixel has a different structure.

SUMMARY OF THE INVENTION

According to an aspect of the invention, there is provided an array-type light receiving device including: a first light collector; a second light collector configured to receive light collected by the first light collector; and a light receiver configured to receive light collected by the second light collector, the first light collector having a spherical shape, the second light collector having a high refractive index portion and a low refractive index portion, and the high refractive index portion having one of a cylindrical shape and a polygonal prismatic shape.

According to an aspect of the invention, there is provided a light collection method for an array-type light receiving device, the method including: collecting light using a first light collector having a spherical shape; collecting the collected light using a second light collector; and causing the light collected by the second light collector to be incident on a light receiver, the second light collector having a high refractive index portion and a low refractive index portion, and the high refractive index portion having one of a cylindrical shape and a polygonal prismatic shape.

DETAILED DESCRIPTION OF THE INVENTION

An embodiment of the invention will now be described with reference to the drawings.

Figure 1:
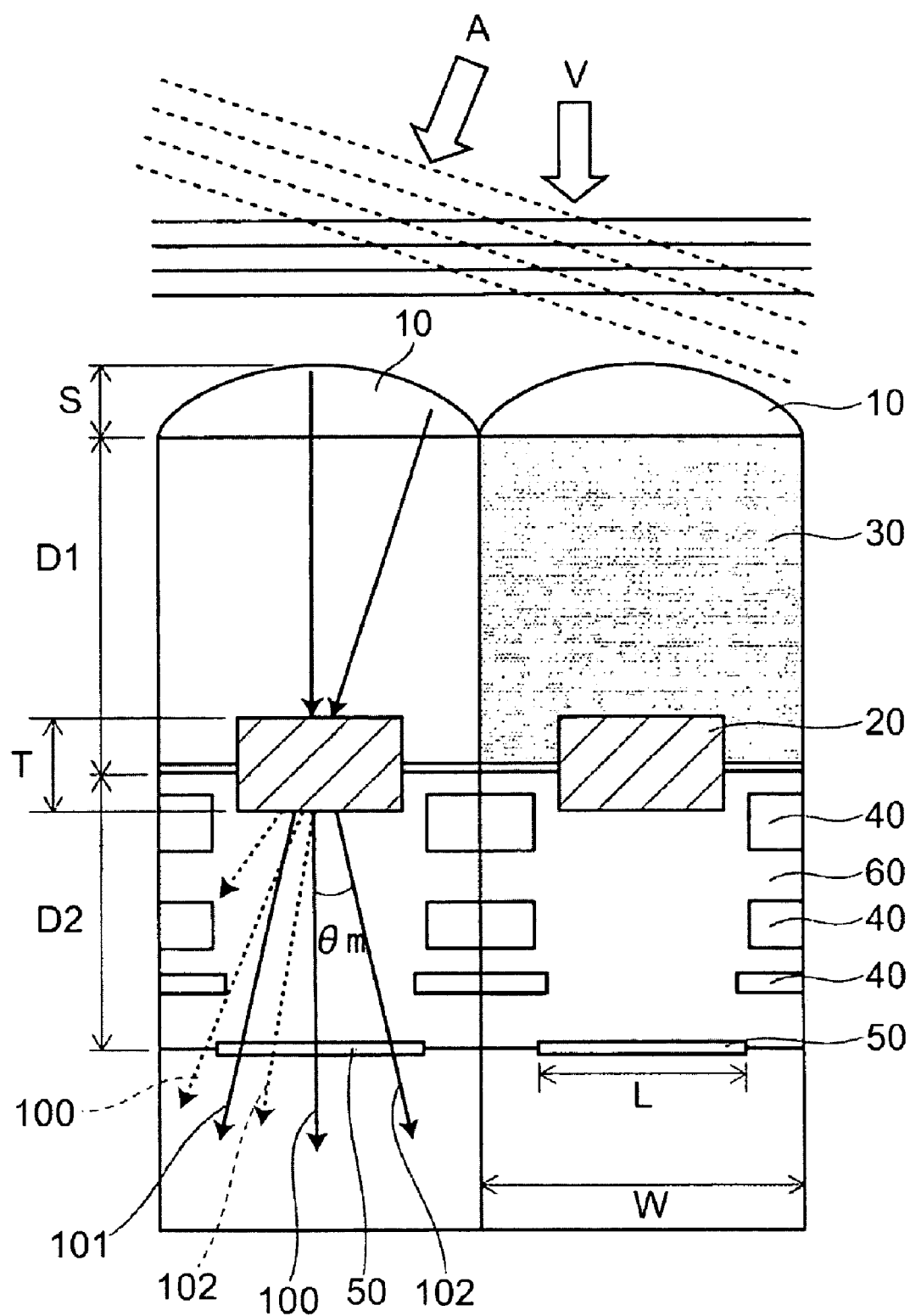
FIG. 1 is a schematic cross-sectional view of an array-type light receiving device according to an embodiment of the invention.

FIG. 1 is a schematic cross-sectional view for illustrating an array-type light receiving device according to the embodiment of the invention.

Figure 2:
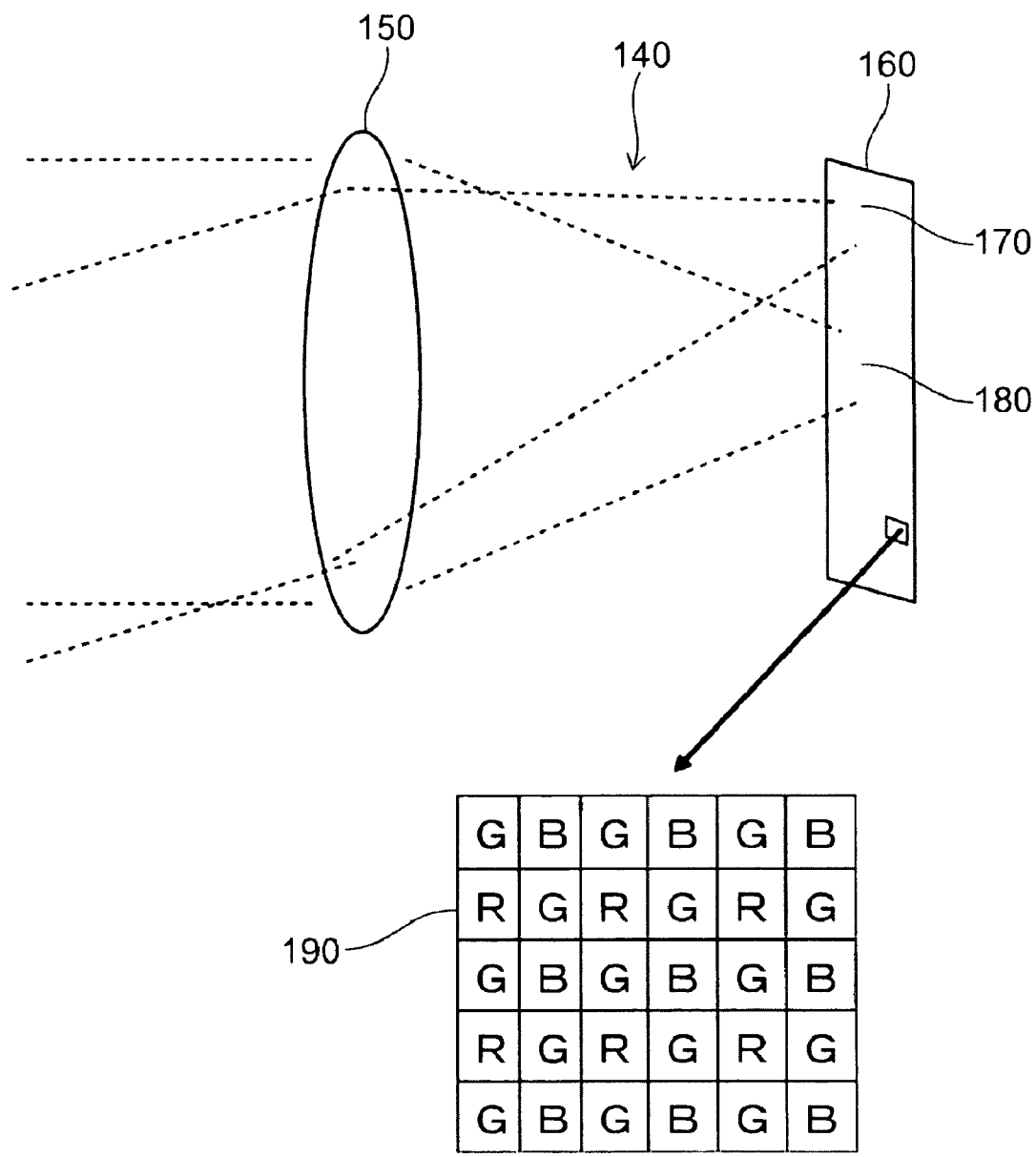
FIG. 2 is a schematic view of a common light receiving unit and an enlarged portion of the array-type light receiving device.

FIG. 2 shows a schematic view of a light receiving unit 140 composed of a camera lens 150 and an array-type light receiving device 160, and an enlarged portion 190 of the array-type light receiving device. Here, R, G, and B in the enlarged portion 190 of the array-type light receiving device represent the position of a device having a red, green, and blue visible light filter, respectively.

First, a description is given with reference to FIG. 2. When light is incident on the array-type light receiving device 160 from the camera lens 150, the component of perpendicularly incident light is intense at the center 180 of the array-type light receiving device, and the component of obliquely incident light is intense at the periphery 170 of the array-type light receiving device. The obliquely incident light impinges on interconnection in the device and may fail to reach the light receiving section in the device, resulting in decreasing the light receiving sensitivity at the periphery. Thus, in two-dimensionally arrayed devices, the light receiving efficiency is high at the center, but low at the periphery, producing a sensitivity difference (shading) therebetween. Furthermore, unless obliquely incident light is delivered to the light receiving section of the device using a light collector, it enters the light receiving section of an adjacent pixel and causes color mottling.

FIG. 1 is a cross-sectional view of two pixels in the array-type light receiving device of this embodiment, showing how incident light is collected. One device comprises, sequentially from the light incident side, a first light collector 10, a color filter 30, a second light collector 20, a metal interconnect section 40, an oxide film 60, and a photoelectric converter 50. The first light collector 10 is a spherical lens, whereas the second light collector 20 illustratively has a cylindrical or prismatic shape. Hence the second light collector 20 is shown by a rectangle in the cross-sectional view. As the pixel size becomes close to the visible light wavelength with the advance of downscaling, the second light collector 20 consequently serves as a grating for diffracting visible light.

The first light collector 10 is used to collect perpendicularly incident light and obliquely incident light at the position of the second light collector 20 in the device. In FIG. 1, a perpendicularly incident plane wave (solid lines) and an obliquely incident plane wave (dashed lines) are indicated by arrows V and A, respectively.

Incident light is collected at the position of the second light collector 20 by the first light collector 10. By the diffraction effect of the arrayed second light collector 20, the incident light is split into zeroth order light with the propagation direction unchanged and ±m-th order light (m=1, 2, ...) with the propagation direction changed to θm. FIG. 1 shows zeroth order light 100, +m-th order light 101, and −m-th order light 102. To increase the light receiving efficiency, it is preferable to be able to receive ±m-th order light for perpendicularly incident light. Let D2 denote the distance between the second light collector 20 and the photoelectric converter 50, and L denote the width of the photoelectric converter 50. Then, m-th order light can be received at the photoelectric converter 50, which serves as a light receiving section, by setting D2 to be equal to L/(2 tan θ) or less.

For obliquely incident light, at a large incident angle, zeroth order light does not enter the photoelectric converter 50. In the case of obliquely incident light from obliquely upper right shown in FIG. 1, only −m-th order light is received. Hence, for obliquely incident light, by designing the shape of the second light collector 20 so as to increase the diffraction efficiency for −m-th order light, the light receiving efficiency for obliquely incident light can be improved without decreasing the light receiving efficiency for perpendicularly incident light.

In the following, a description is given of the design of the shape of the second light collector 20 and a light collection method based on the designed second light collector 20. The design is intended to minimize the diffraction efficiency for zeroth order light and increase the higher order diffraction efficiency. In the cases where the second light collector has a cylindrical or prismatic shape and a spherical shape, the diffraction efficiency was calculated by simulation. It was then found that the diffraction efficiency is improved in the case where the second light collector 20 has a cylindrical or prismatic shape as compared with a spherical shape.

Parameters used in the calculation are as follows. The pixel pitch size W was 1.75 μm. The width L of the photoelectric converter 50 serving as the light receiving section was 1.15 μm. The height S of the spherical lens of the first light collector 10 was 0.4 μm. The height D1 of the color filter 30, that is, the distance between the first and second light collector, was 1.8 μm. The height T of the second light collector 20 was 0.58 μm. The distance D2 between the second light collector 20 and the photoelectric converter 50 was 1.8 μm. In the case where the second light collector 20 is a spherical lens, the height of the sphere was 0.2 μm, and the adjacent lenses were arrayed with no gap therebetween.

The wavelength λ was 0.53 μm. The first light collector 10 and the color filter 30 can be made of resin, and its refractive index is illustratively 1.55. The second light collector 20 is made of a material having a higher refractive index than the surroundings, and its refractive index is illustratively 1.9. The material thereof can be SiN, for example. An oxide film illustratively made of $SiO_2$ can be provided between the second light collector 20 and the photoelectric converter 50. In this case, its refractive index is 1.45.

The metal interconnect section 40 serves as a data transfer section, and can be made of Al or W, for example. The photoelectric converter 50 can be a light receiving section made of Si.

The simulation was performed by vector wave analysis. More specifically, it was performed by solving Maxwell's equations in the time domain. The light receiving efficiency and the diffraction efficiency were calculated for TE polarization and TM polarization and averaged, respectively. The incident angle was varied from perpendicular incidence to 30° incidence in each calculation.

Figure 3:
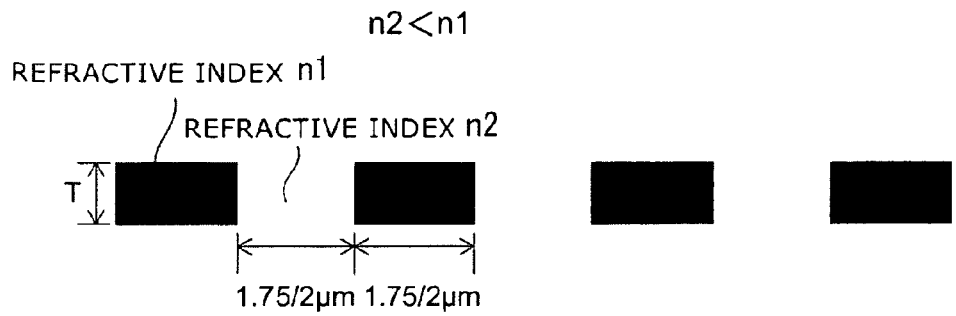
FIG. 3 is a schematic view of the second light collector shown as a grating.

FIG. 3 is a schematic view of the second light collector 20 represented by a grating.

This figure shows the case where the second light collector 20 constitutes a grating having a rectangular cross section, which is used for simulation in a two-dimensional cross section. Incident light is diffracted by a repetition unit composed of a high refractive index portion having a refractive index of n1=1.9 and a low refractive index portion having a refractive index of n2=1.45. In parallel with what is described later in the three-dimensional case, also in the two-dimensional cross section simulation, an optimal value exists for the size ratio between the high refractive index portion and the low refractive index portion in minimizing the diffraction efficiency for zeroth order light and increasing the higher order diffraction efficiency. The optimal value is 1:1. Hence, in FIG. 3, the length of the high refractive index portion and the low refractive index portion is set to 1.75/2 µm, which is ½ of the pixel pitch size in this calculation example, 1.75 µm.

The theoretically ideal condition for vanishing of zeroth order light is $T=\lambda/(2(n1-n2))$. This is derived from the condition in which the optical path difference between the high refractive index portion and the low refractive index portion is $\lambda/2$.

Here, the relationship between the position of the second light collector 20 and the low refractive index portion is described. In the case where the pixel pitch size is 1.75 µm, D1 and D2 are set to 1.8 µm as described above, and the second light collector 20 needs to be located at a focal position of the first light collector 10. In the case where the high refractive index portion is entirely located in the oxide film 60, T=0.588 µm is the ideal value according to the above ideal formula.

On the other hand, in the case where the high refractive index portion is entirely located in the color filter 30, the low refractive index portion has a refractive index of 1.55, and T=0.75 µm. However, in practice, the high refractive index portion extends over the color filter 30 and the oxide film 60. To be precise in this case, let T1 and nc (=1.55) denote its height and refractive index on the color filter side, and T2 and no (=1.45) denote its height and refractive index on the oxide film side. Then, T is given by $T=\lambda/(2\times n1)+(nc\times T1+no\times T2)/n1$. T1=0 and T2=0 yield T=0.588 and T=0.75, respectively.

From the viewpoint of using diffraction to cause m-th order diffracted light to be efficiently incident on the photoelectric converter 50 and improve the light receiving efficiency for obliquely incident light, the refractive index difference is preferably large so as to increase the diffraction angle. To this end, preferably, the high refractive index portion is entirely located in the oxide film having a refractive index of 1.45. Furthermore, for perpendicularly incident light, as described with reference to FIG. 1, the distance D2 between the second light collector 20 and the photoelectric converter 50 is preferably small. Hence, embedding the high refractive index portion of the second light collector 20 in the oxide film 60 is effective at improving the light receiving efficiency using diffraction. However, improvement in light receiving efficiency is expected also in the case of embedding it in the color filter 30.

Figure 4:
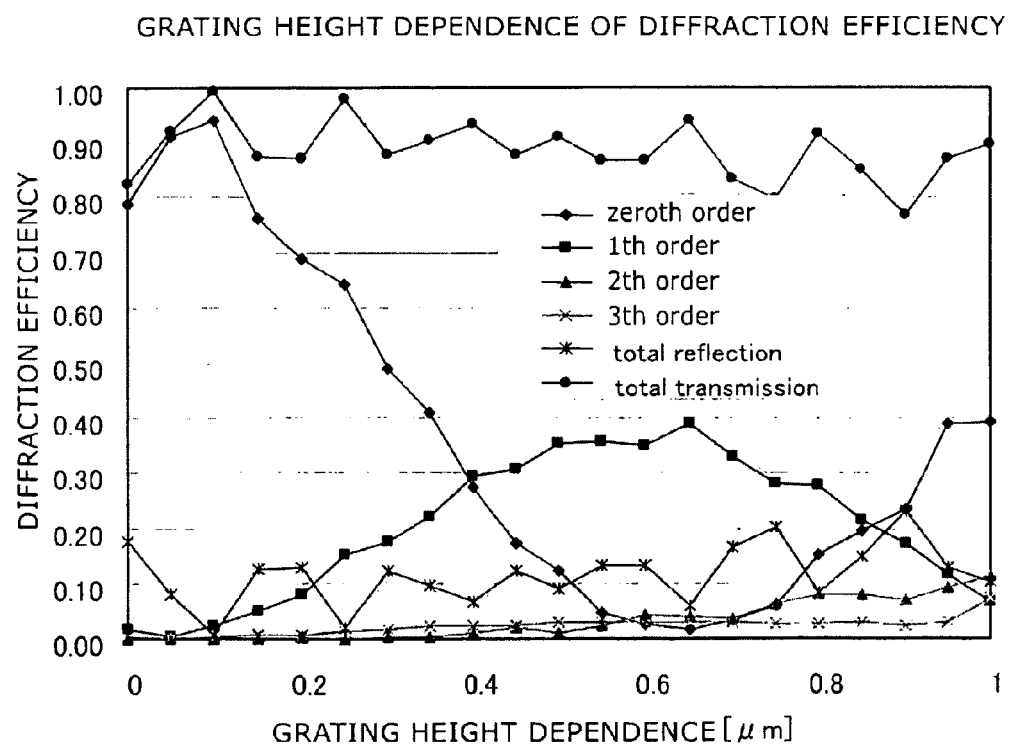
FIG. 4 is a graph showing the results of simulating the dependence of diffraction efficiency on the height T of the second light collector in a two-dimensional cross section for perpendicular incidence.

FIG. 4 is a graph showing the results of simulating the dependence of diffraction efficiency on the height T of the second light collector 20 in a two-dimensional cross section for perpendicular incidence. The simulation was performed using n1=1.9 and n2=1.45, and the graph shows the results for diffracted light up to the third order, total transmission, and total reflection. In the ideal condition, the height T for vanishing of zeroth order light is 0.588 µm. However, because the pixel pitch size W is 1.75 µm, zeroth order light is minimized at T=0.65 µm. If the pixel pitch size W is decreased, T is approximated to the value for the ideal condition, 0.588 µm.

FIGS. 5 to 7 show the calculation result of two-dimensional cross section simulation for diffraction efficiency in relation to the shape of the second light collector.

Figure 5A:
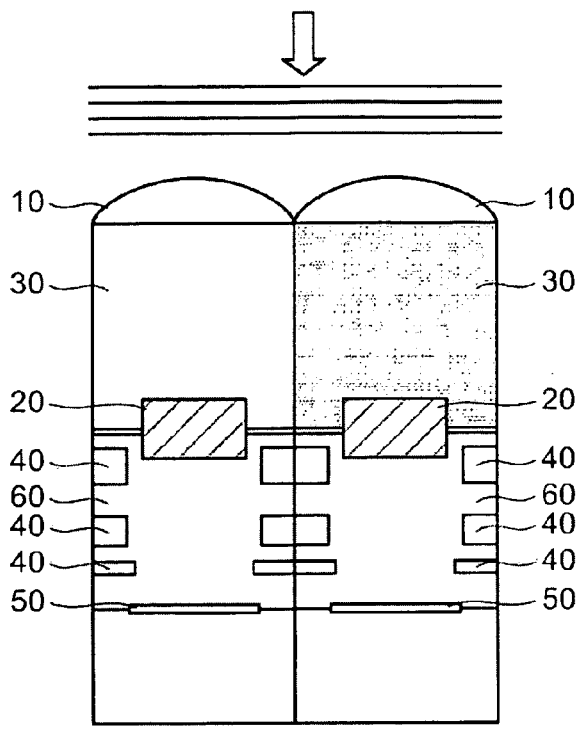
FIGS. 5A to 5B show the calculation result of simulation for diffraction efficiency of the perpendicularly incident light by the second light collector having a rectangular cross-sectional shape.
Figure 5B:
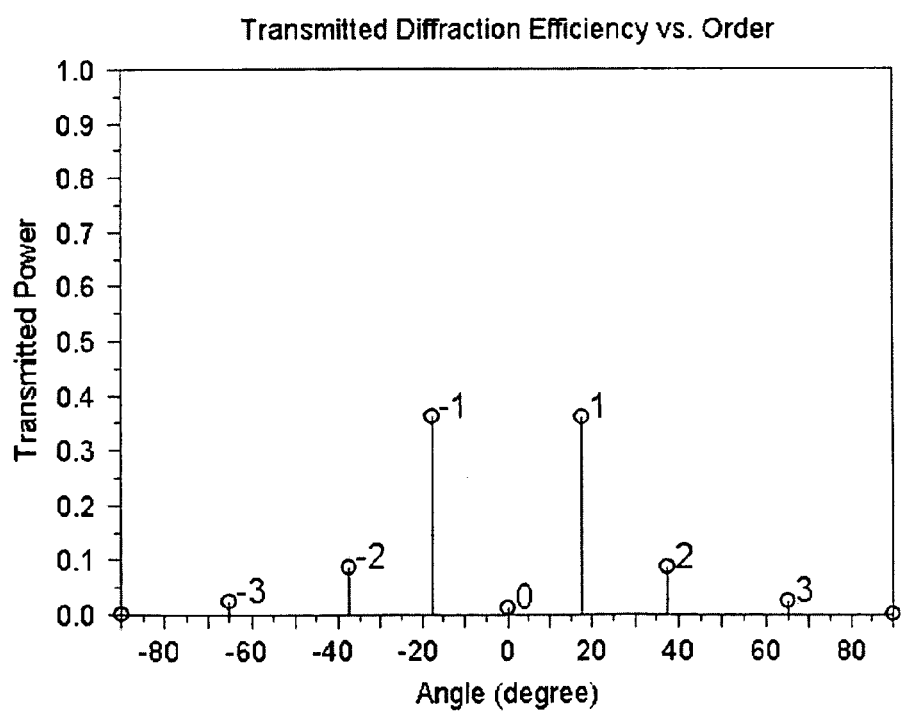

FIG. 5A shows the case where light is perpendicularly incident on the array-type light receiving device in which the second light collector 20 constitutes a cylindrical or prismatic grating having a rectangular cross-sectional shape. FIG. 5B shows the result of two-dimensional cross section simulation for diffraction efficiency in the case of perpendicularly incident light. Zeroth order light is the weakest, and ±1st order light has a highest intensity. Here, T=0.65 µm is used. Although this is different from the ideal value, it is based on the result obtained from the investigation on the height dependence of diffraction efficiency in FIG. 4.

Figure 6A:
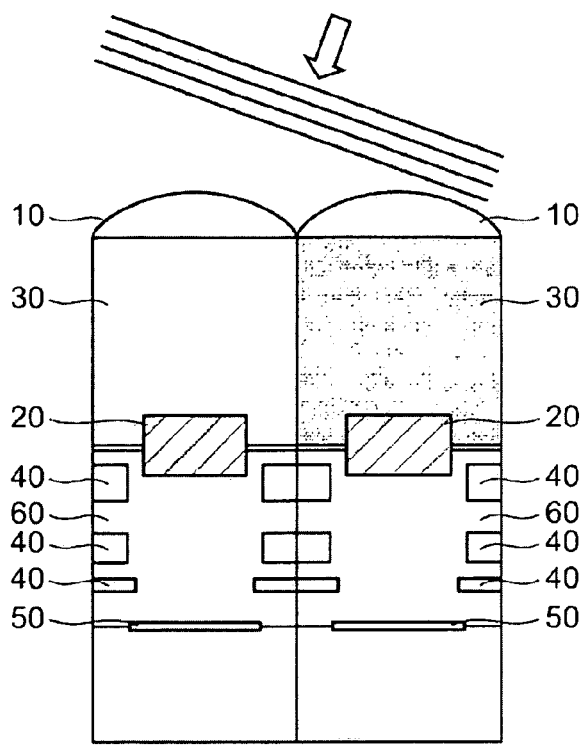
FIGS. 6A to 6B show the calculation result of simulation for diffraction efficiency of the obliquely incident light at an angle of 20° by the second light collector having a rectangular cross-sectional shape.
Figure 6B:
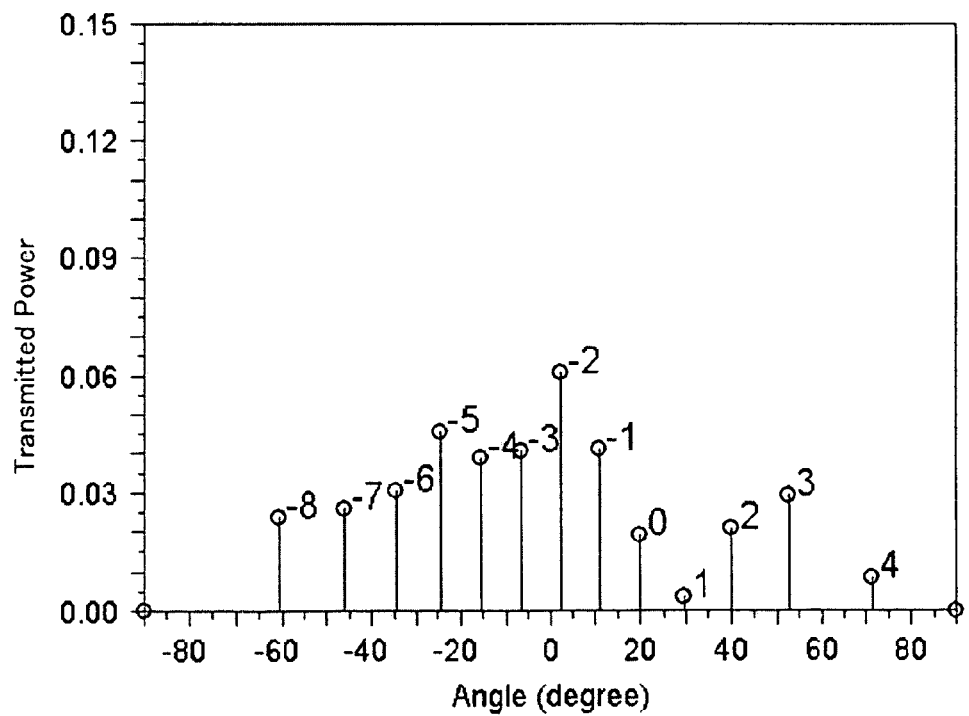

FIG. 6A shows the case where light is obliquely incident at an angle of 20° on the array-type light receiving device in which the second light collector 20 constitutes a cylindrical or prismatic grating having a rectangular cross-sectional shape. FIG. 6B shows the result of two-dimensional cross section simulation for diffraction efficiency in the case of obliquely incident light at an angle of 20°. First order light is the weakest, and −2nd order light with maximum intensity has a nearly perpendicular direction.

From the relation $D2=L/(2\tan\theta)$, using D2=1.8 µm and L=1.15 µm, the diffraction angle allowing diffracted light to be incident on the light receiving section is determined to be approximately 17.5°. Hence, according to the two-dimensional calculation, for perpendicular incidence, zeroth order light and ±1st order light are incident on the photoelectric converter 50, which serves as the light receiving section. For 20° incidence, −1st to −3rd light is incident on the photoelectric converter 50. For both perpendicular incidence and oblique incidence, diffracted light with maximum intensity, that is, ±1st order light for perpendicular incidence and −2nd order light for oblique incidence, reaches the photoelectric converter 50, which serves as the light receiving section. This suggests that the decrease of light receiving efficiency is prevented even if light is obliquely incident on the periphery of the array-type light receiving device.

Figure 7A:
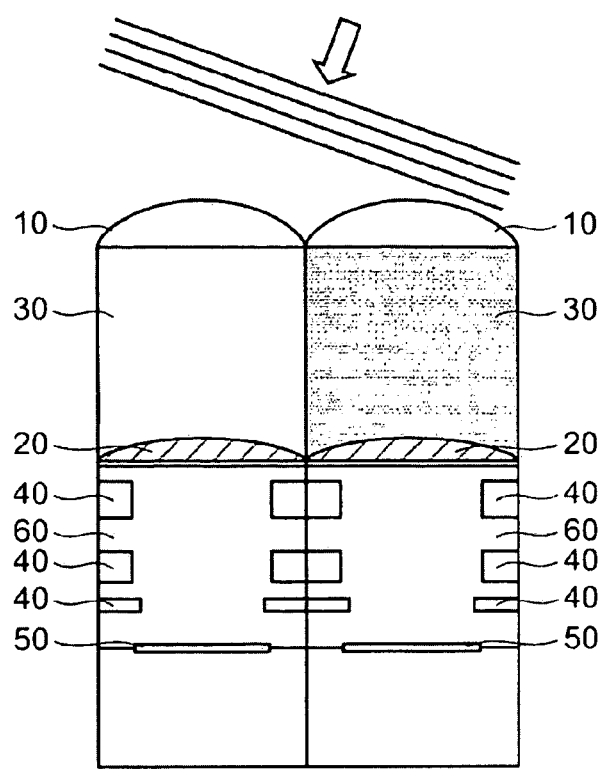
FIGS. 7A to 7B show the calculation result of simulation for diffraction efficiency of the obliquely incident light at an angle of 20° by the second light collector having a spherical cross-sectional shape.
Figure 7B:
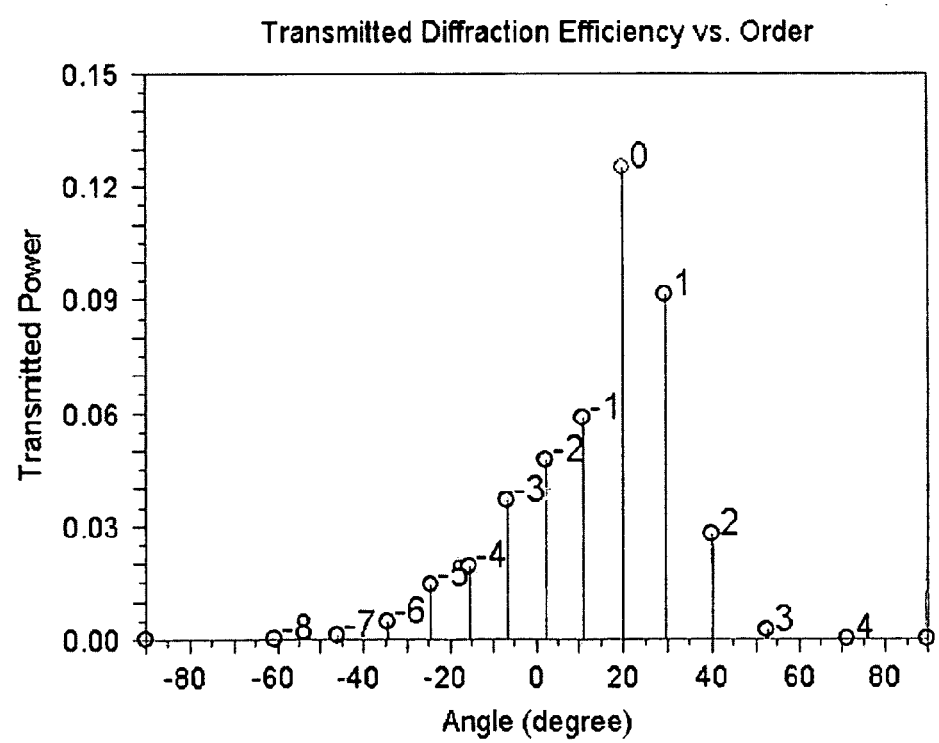

FIG. 7A shows the case where light is obliquely incident at an angle of 20° on the array-type light receiving device in which the second light collector 20 has a spherical shape. FIG. 7B shows the result of simulation in a two-dimensional cross section for diffraction efficiency in the case of obliquely incident light at an angle of 20°. Zeroth order light is the strongest, but has a large diffraction angle, and cannot be incident on the photoelectric converter 50, which serves as the light receiving section. Considering that the diffraction angle allowing diffracted light to be incident on the light receiving section is determined to be approximately 17.5°, −1st to −3rd light is incident on the photoelectric converter 50 according to the two-dimensional calculation.

In the case where the second light collector has a spherical shape, zeroth order light and first order light having high intensity cannot be incident on the photoelectric converter 50, which serves as the light receiving section, at the periphery of the array-type light receiving device. This suggests that the light receiving efficiency decreases.

Figure 8:
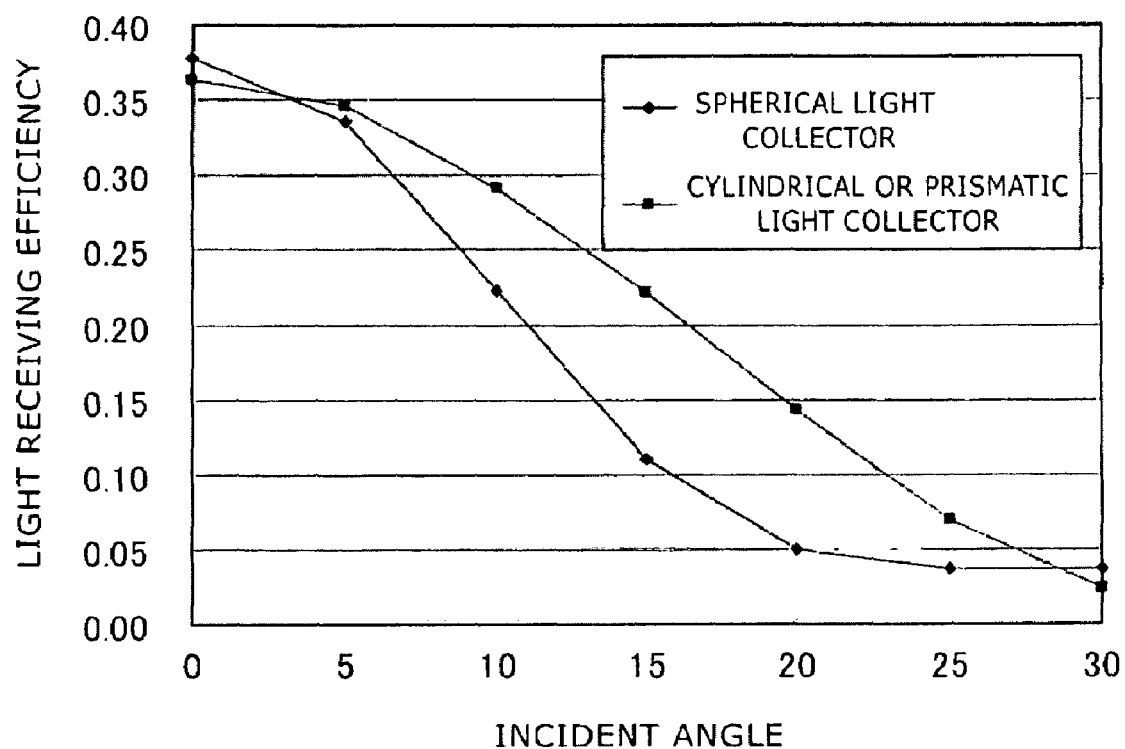
FIG. 8 is a graph showing the simulation result for incident angle dependence of light receiving efficiency in relation to the shape of the second light collector.

FIG. 8 is a graph showing the result of simulation in a two-dimensional cross section for incident angle dependence of light receiving efficiency in relation to the shape of the second light collector 20.

For perpendicular incidence, in the case where the second light collector 20 has a cylindrical or prismatic shape, the light receiving efficiency decreases due to the effect of incidence diffraction. The light receiving efficiency is slightly higher in the case where the second light collector 20 is spherical, but the difference is small. On the other hand, in a wide angle range of oblique incidence, the light receiving efficiency is higher in the case where the second light collector 20 has a cylindrical or prismatic shape. Hence, the overall light receiving efficiency across the overall incident angle is higher in the case where the second light collector 20 has a cylindrical or prismatic shape. Thus, shading can be reduced by using the second light collector 20 having a cylindrical or prismatic shape.

Next, with regard to the second light collector 20 having a prismatic or cylindrical shape, the result of three-dimensional simulation for diffraction efficiency is described. It is assumed that the second light collector 20 is a grating made of an infinite array of prisms or cylinders on the xy plane at regular pitches of 1.75 μm.

In three-dimensional calculation, the diffracted light is composed of ±(m,n)-th order light. The second light collector 20 is a grating in which high refractive index portions and low refractive index portions are periodically repeated. The diffraction efficiency depends on the area ratio between the high refractive index portion and the low refractive index portion in the repetition unit.

An array-type light receiving device with reduced shading at the periphery can be realized by optimizing the area ratio of cross section between the high refractive index portion and the low refractive index portion.

Furthermore, using the diffracted light obtained by the second light collector 20, the direction of obliquely incident light can be changed so that the photoelectric converter 50 can receive it.

Figure 9:
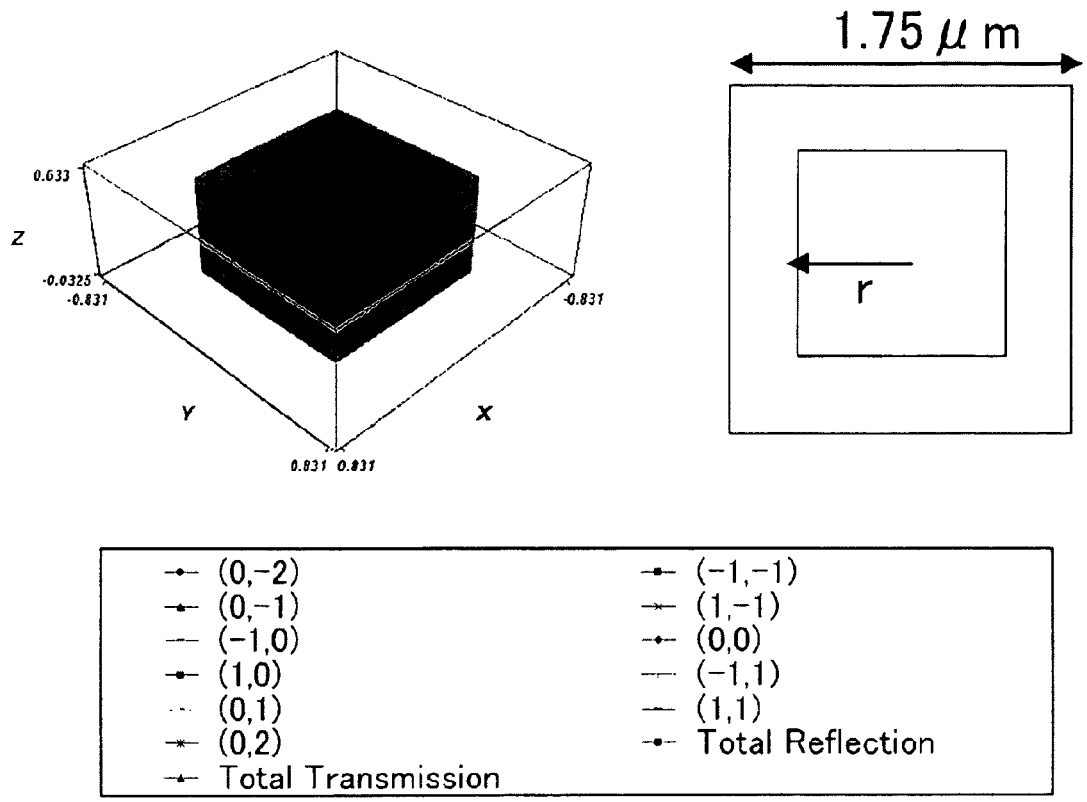
FIG. 9 is a graph showing the three-dimensional simulation result for the area ratio dependence of diffraction efficiency with regard to the second light collector having a prismatic shape.
Figure 9:
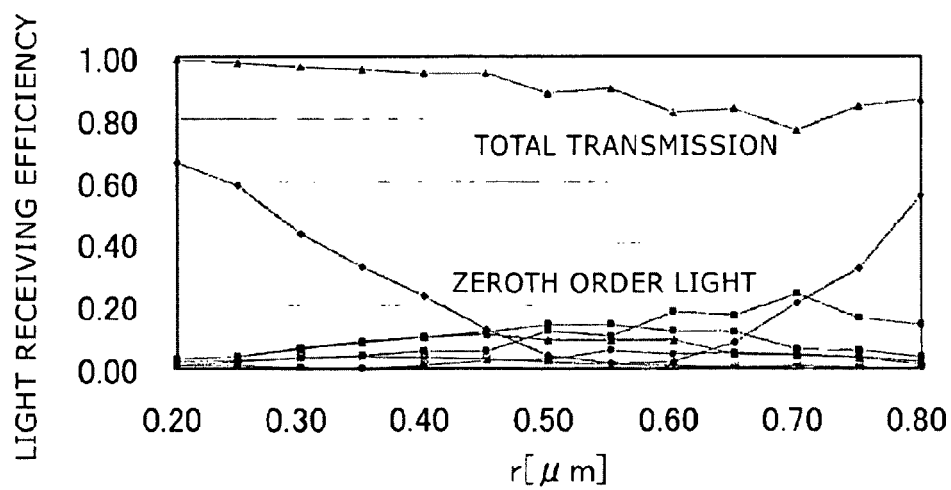

FIG. 9 shows the area ratio dependence of diffraction efficiency in the case where the high refractive index portion has a prismatic shape. The pixel pitch size W is 1.75 μm, and the length of a side of the cross section of the prismatic high refractive index portion is set to 2r. The figure shows the r-dependence of diffraction efficiency. (0,0)-th order light is minimized and higher order diffracted light is higher in the case where the area ratio between the high refractive index portion and the low refractive index portion is 1:1. The area ratio equals 1:1 for r=0.62 μm. However, actually, the diffraction efficiency for (0,0)-th order light is minimized at a value lower than r=0.62 μm. This is attributable to the effect of the grating pitch, that is, the pixel pitch size and shape.

Figure 10:
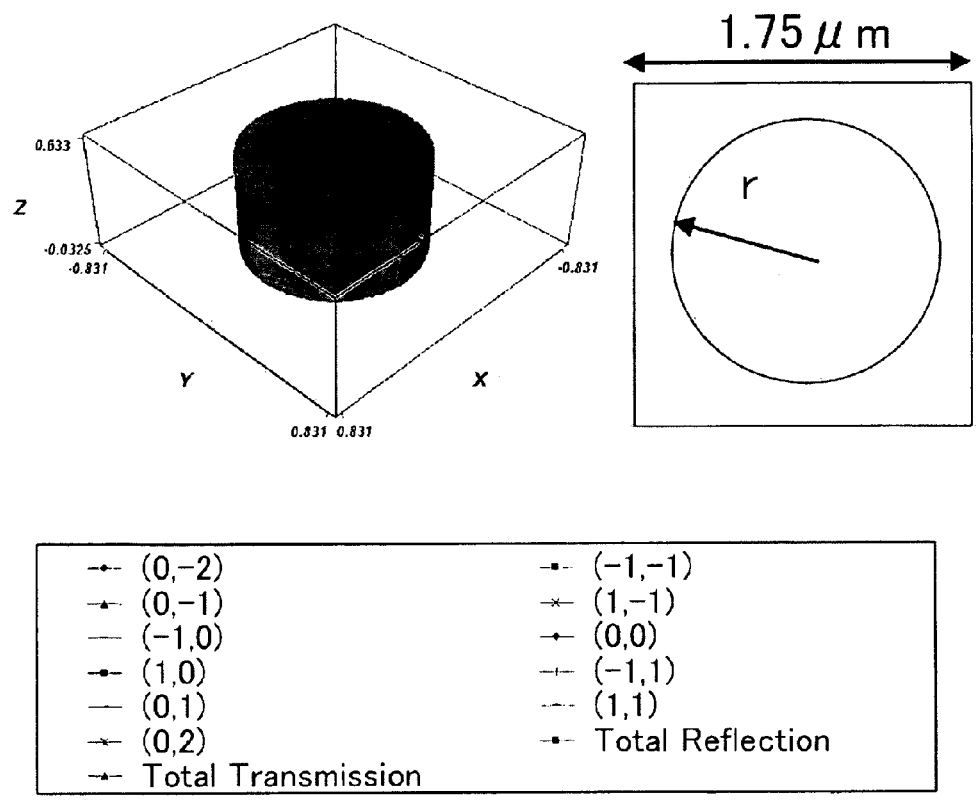
FIG. 10 is a graph showing the three-dimensional simulation result for area ratio dependence of diffraction efficiency with regard to the second light collector having a cylindrical shape.
Figure 10:
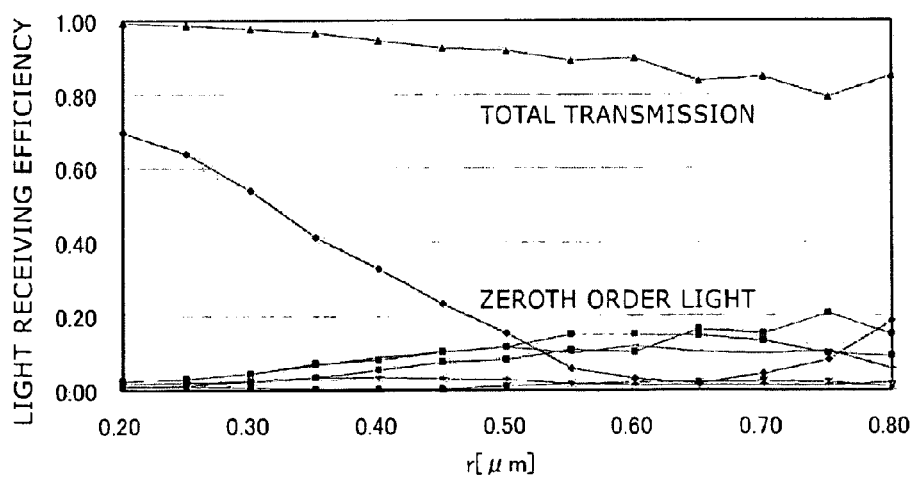

FIG. 10 shows the area ratio dependence of diffraction efficiency in the case where the high refractive index portion has a cylindrical shape. The pixel pitch size W is 1.75 μm, and the radius of the cross-sectional circle of the cylindrical high refractive index portion is set to r. The figure shows the r-dependence of diffraction efficiency. (0,0)-th order light is minimized and higher order diffracted light is higher in the case where the area ratio between the high refractive index portion and the low refractive index portion is 1:1. The area ratio equals 1:1 for r=0.69 μm. However, actually, the diffraction efficiency for (0,0)-th order light is minimized at a value lower than r=0.69 μm. This is attributable to the effect of the grating pitch, that is, the pixel pitch size and shape.

FIG. 11 shows the result of simulation in three dimensions for the dependence of diffraction efficiency on the shape of the second light collector.

Figure 11A:
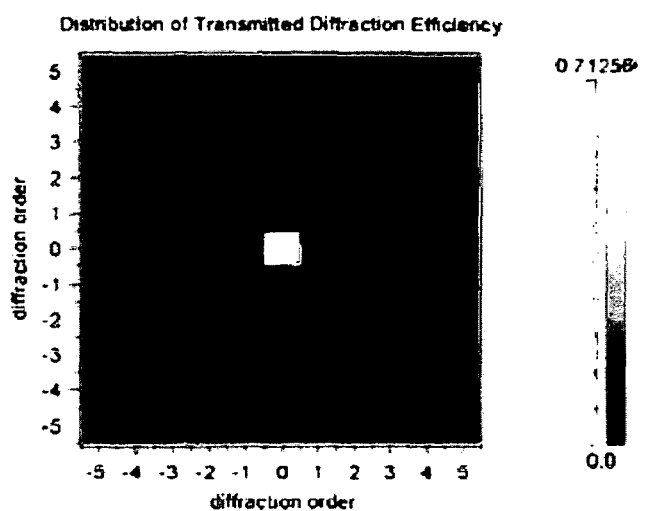
FIG. 11 shows dependence of diffraction efficiency on the shape of the second light collector.
Figure 11B:
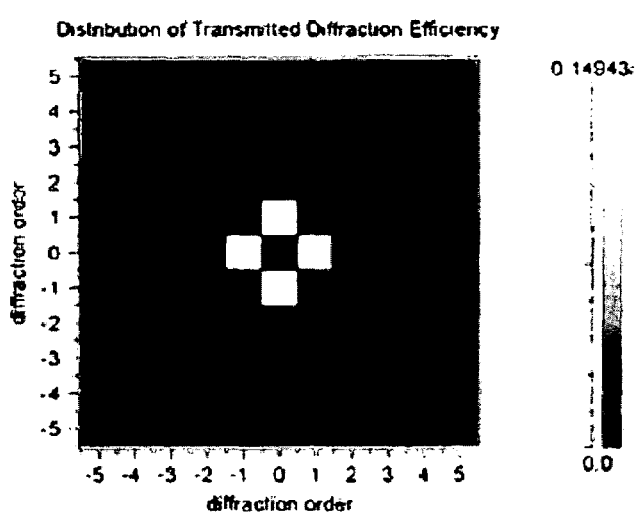
Figure 11C:
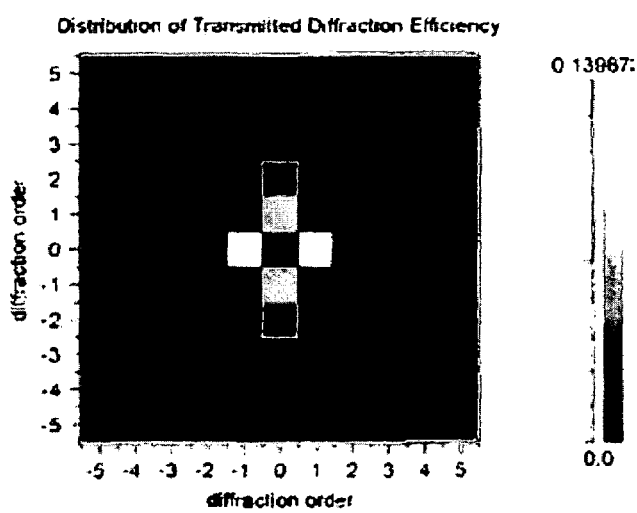

FIG. 11A shows the case for a spherical second light collector. FIG. 11B shows the case for a cylindrical light collector in which the area ratio between the high refractive index portion and the low refractive index portion is 1:1, and the height T of the rectangular second light collector is $T=\lambda/(2\Delta n)$, where $\lambda$ is the incident light wavelength, and $\Delta n$ is the refractive index difference between the high refractive index portion and the low refractive index portion. FIG. 11C the case for a prismatic light collector in which the area ratio between the high refractive index portion and the low refractive index portion is 1:1, and $T=\lambda/(2\Delta n)$.

In each case, higher order diffracted light up to ±5th order diffracted light is taken into calculation Zeroth order light is strong in the spherical case. However, in the cylindrical and prismatic case, zeroth order light is weak, but ±m-th order light, particularly (±1,0)-th order light, is strong. Hence, in contrast to the spherical shape, using the diffraction effect, the cylindrical or prismatic shape allows obliquely incident light to be also incident on the photoelectric converter 50 as diffracted light. Hence the light receiving efficiency can be increased for obliquely incident light.

Figure 12:
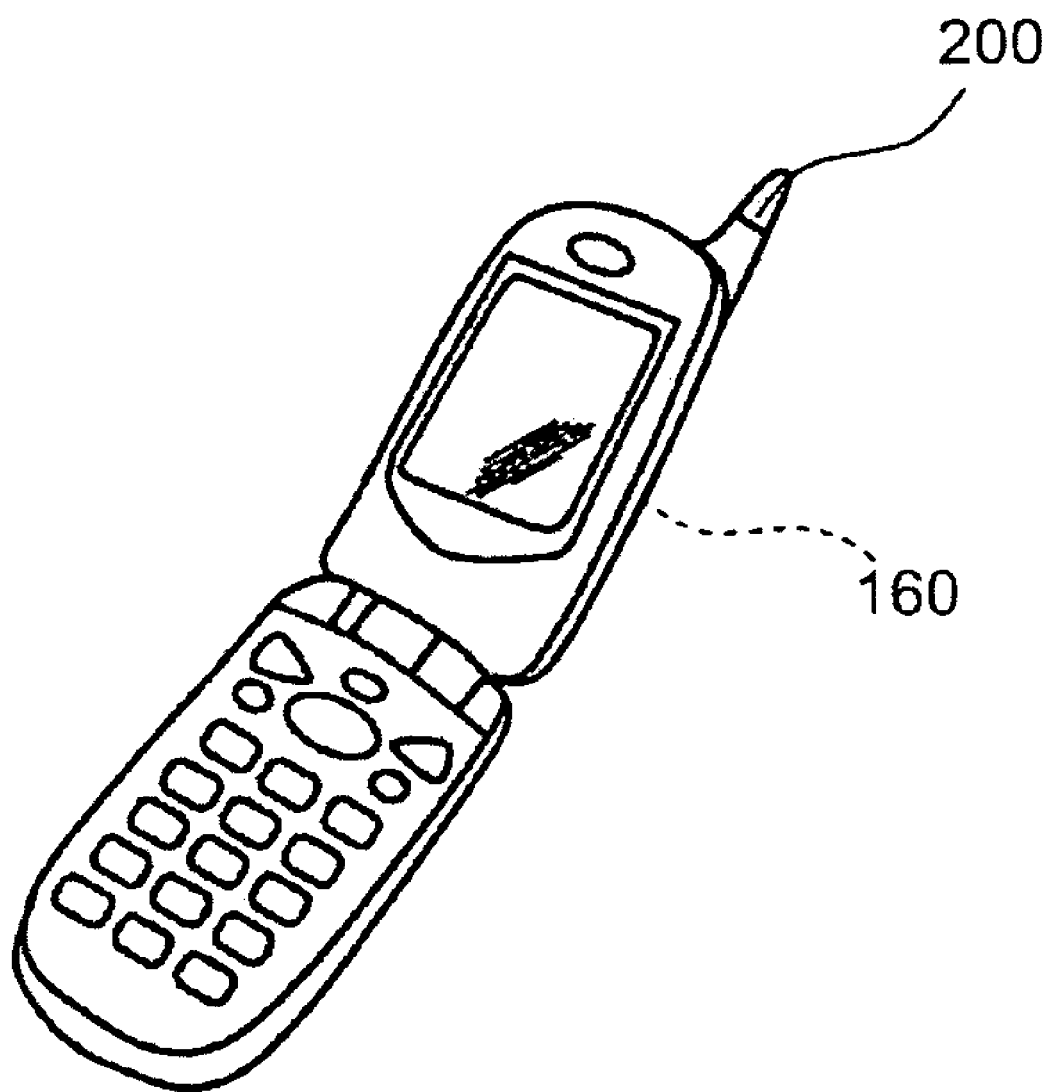
FIG. 12 is a schematic view showing a mobile phone in which the array-type light receiving device according to this embodiment is mounted.

FIG. 12 shows a mobile phone 200 in which the array-type light receiving device 160 according to this embodiment is mounted.

According to this embodiment, anti-shading techniques in response to the downscaling of array-type light receiving devices make them applicable to mobile phone-mounted cameras with higher pixel counts. In compact digital cameras, this embodiment can contribute to simultaneously achieving downsizing and high image quality.

The embodiment of the invention has been described with reference to the examples. However, the invention is not limited to these examples. For instance, the second light collector 20 can be made of high refractive index materials such as $HfO_2$ (n=2.15) and $TiO_2$ (n=2.52). If the high refractive index portion has a higher refractive index, the refractive index difference can be increased. Hence, in $T=\lambda/(2(n1-n2))$, the height T of the second light collector 20 can be decreased.

In simulations, the prismatic and cylindrical shape have been investigated. However, shapes with beveled side faces can be also used. More specifically, in contrast to the case where the second light collector 20 has a spherical shape, steep variation in shape causes disturbances in the wave front, which decrease the intensity of higher order diffracted light. Hence, even if the side face is beveled, the diffraction efficiency and the light receiving efficiency can be increased as long as there is a shape variation steep enough to cause disturbances in the wave front.

If the height T of the high refractive index portion of the second light collector 20 is approximately 0.6 to 0.7 μm, the side face may be beveled in association with processing. However, it is sufficiently possible to keep steepness enough to cause disturbances in the wave front.

The surface of the high refractive index portion is preferably flat. Here, the flatness level achieved by normal processing is sufficient.

Furthermore, the cross-sectional shape of the high refractive index portion of the second light collector 20 is not limited to a square or a circle. It can be a regular polygon such as a regular hexagon or a polygon having a shape close to a circle as long as array pitches are not extremely different in the horizontal and vertical direction and the periodicity for serving as a grating is retained.

The invention claimed is:

1. An array-type light receiving device comprising:
   a first light collector;
   a second light collector configured to receive light collected by the first light collector; and
   a light receiver configured to receive light collected by the second light collector,
   the first light collector having a spherical shape,
   the second light collector having a high refractive index portion and a low refractive index portion, and having a height T given by $T=\lambda/2\Delta n$, where $\Delta n$ is the refractive index difference between the high refractive index portion and the low refractive index portion, and $\lambda$ being the wavelength of incident light, and
   the high refractive index portion having a cylindrical shape or a polygonal prismatic shape.

2. The array-type light receiving device according to claim 1, wherein the high refractive index portion and the low refractive index portion have an area ratio of 1:1.

3. The array-type light receiving device according to claim 1, wherein the second light collector has a light incident surface located at a focal position of the first light collector.

4. The array-type light receiving device according to claim 1, further comprising:
a color filter provided between the first light collector and the second light collector, the color filter having a refractive index which is lower than a refractive index of the high refractive index portion.

5. The array-type light receiving device according to claim 1, further comprising:
an oxide film provided between the second light collector and the light receiver, the oxide film having a refractive index which is lower than a refractive index of the high refractive index portion.

6. The array-type light receiving device according to claim 1, further comprising a metal interconnection section provided between the second light collector and the light receiver, the metal interconnection section serving data transfer.

7. The array-type light receiving device according to claim 1, wherein the light receiver is a photoelectric converter.

8. The array-type light receiving device according to claim 1, wherein the second light collector includes periodic repetition units of the high refractive index portion and the low refractive index portion.

9. The array-type light receiving device according to claim 8, wherein the light collected by the first light collector is diffracted by the repetition unit.

10. The array-type light receiving device according to claim 9, wherein at least diffracted light with maximum intensity of diffracted light by the repetition unit for perpendicularly incident light reaches the light receiver.

11. The array-type light receiving device according to claim 9, wherein at least a light with maximum intensity of the diffracted light by the repetition unit for obliquely incident light reaches the light receiver.

12. An array-type light receiving device comprising:
a first light collector;
a second light collector configured to receive light collected by the first light collector; and
a light receiver configured to receive light collected by the second light collector,
the second light collector having a high refractive index portion and a low refractive index portion, the high refractive index portion having a cylindrical shape or a polygonal prismatic shape, and
the distance between the second light collector and the light receiver being $L/(2 \tan \theta)$ or less, where $\theta$ is the diffraction angle of the primary diffracted light of perpendicularly incident light, and L is the width of the light receiver.

13. A light collection method for an array-type light receiving device, the method comprising:
collecting light using a first light collector having a spherical shape;
collecting the collected light using a second light collector; and
causing the light collected by the second light collector to be incident on a light receiver,
the second light collector having a high refractive index portion and a low refractive index portion,
the high refractive index portion having a cylindrical shape or a polygonal prismatic shape, and
diffraction efficiency for zeroth order light being minimized and diffraction efficiency for higher order light being increased by giving $T=\lambda/2\Delta n$ as a height T of the second light collector, where $\Delta n$ is the refractive index difference between the high refractive index portion and the low refractive index portion, and $\lambda$ is the wavelength of incident light, and by giving a ratio of 1:1 as an area ratio of the high refractive index portion and the low refractive index portion.

14. The light collection method for an array-type light receiving device according to claim 13, wherein the light collected by the first light collector is collected by the second light collector having a light incident surface located at a focal position of the first light collector.

15. The light collection method for an array-type light receiving device according to claim 13, wherein the incident light to the second light collector is diffracted by a periodic repetition unit including the high refractive index portion and the low refractive index portion.

16. The light collection method for an array-type light receiving device according to claim 15, where at least a light with maximum intensity of the diffracted light by the repetition unit for perpendicularly incident light is received by the light receiver.

17. The light collection method for an array-type light receiving device according to claim 15, where at least a light with maximum intensity of the diffracted light by the repetition unit for obliquely incident light is received by the light receiver.

18. A light collection method for an array-type light receiving device, the method comprising:
collecting light using a first light collector having a spherical shape;
collecting the collected light using a second light collector; and
causing the light collected by the second light collector to be incident on a light receiver,
the second light collector having a high refractive index portion and a low refractive index portion, the high refractive index portion having a cylindrical shape or a polygonal prismatic shape, and
diffracted light, having a diffraction angle of $\theta$, being able to be incident to the light receiver for perpendicularly incident light by setting the distance between the second light collector and the light receiver to $L/(2 \tan \theta)$ or less, where $\theta$ is the diffraction angle of the primary diffracted light of perpendicularly incident light, and L is the width of the light receiver.

* * * * *